(12) United States Patent
Stemm

(10) Patent No.: US 6,435,957 B1
(45) Date of Patent: Aug. 20, 2002

(54) WAFER POLISHING PAD CENTERING APPARATUS

(75) Inventor: Terrence Stemm, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/750,839

(22) Filed: Dec. 28, 2000

(51) Int. Cl.⁷ .................................................. B24B 11/10
(52) U.S. Cl. ...................................... 451/360; 451/290
(58) Field of Search ................................ 451/360, 278, 451/288, 290

(56) References Cited

U.S. PATENT DOCUMENTS 6,129,611 A * 10/2000 Yamaguchi ................. 451/278

FOREIGN PATENT DOCUMENTS

| CH | 41107 | * | 7/1911 | ................. | 451/360 |
| DE | 272112 | * | 3/1914 | ................. | 451/360 |
| GB | 14139 | * | of 1908 | ................. | 451/360 |

* cited by examiner

*Primary Examiner*—Joseph J. Hail, III
*Assistant Examiner*—Anthony Ojini
(74) *Attorney, Agent, or Firm*—Blakely, Sokoloff, Taylor & Zafman LLP

(57) ABSTRACT

A set of spacing clips and a method of use therefor are described. Polishing pads utilized in wafer polishing machines, such as the MirraTrak™ and MiraMesa™ polishers made by Applied Materials, Inc., must be centered on polisher's platens. The polishing pads are generally of a larger diameter than the platens, and are held on the platen by a pressure-sensitive adhesive present on the backside of the pads. Each centering clip has two surfaces that are spaced apart from each other by the distance that a polishing pad will overhang the platen when properly centered on the platen. One surface of each of two centering clips is butted up against the edge of the circular pad and clamped to the pad. As the pad is lowered into place on the circular platen, the other surface of each clip is butted against the outside edge of the platen, ensuring that the pad will be centered on the platen when the adhesive backed pad contacts the platen.

33 Claims, 6 Drawing Sheets

WAFER POLISHING PAD CENTERING APPARATUS

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever.

BACKGROUND OF THE INVENTION

1. Field of the Invention

The invention relates generally to the field of integrated circuit fabrication. More particularly, the invention relates to the installation and centering of a polishing pad on a Chemical Mechanical Process (CMP) polishing machine using a centering apparatus.

2. Description of the Related Art

After circuitry has been burned into a silicon wafer containing a number of potential integrated circuit chips, an oxide layer is applied to the surface of the wafer. The oxide layer protects and insulates the circuitry. "Holes" are etched in the oxide layer to circuit connection points and metal interconnects are deposited thereon, and metal traces are formed of the oxide layer surface. A number of interconnect layers are necessary to make electrical connections with all of the circuitry on the wafer. Accordingly, a new oxide layer is deposited on top of the prior layer to electrically isolate the interconnects and traces. Because the topography of the surface on which each of the successive oxide layers is deposited is not planar, the resulting oxide surface is also not planar. Planarity is necessary, however, so that the next layer of metal interconnects may be deposited on the chip. To achieve the necessary planarity, a chemical mechanical process (CMP) is typically utilized.

CMP is an abrasive process using chemical slurries and a circular sanding action to polish the surface of the oxide layer smooth. Typical wafer polishers, such as the MirraMesa™ by Applied Materials, Inc., have multiple rotating platens and multiple heads to hold silicon wafers, facilitating the polishing of more than one wafer simultaneously.

Prior art FIGS. 1a and 1b illustrate two views of a portion of a CMP polishing machine. A rotating platen 100 is secured to the polisher base. A polishing pad 110, such as IC1000 pads by Rodell, Incorporated of Newark, Del. made of a polymeric material is secured to the top of the platen 100 with a pressure-sensitive adhesive. The polishing pad typically has a diameter greater than the platen and accordingly, the edge of the polishing pad 110 extends beyond the edge of the platen 100. The polishing pad comprises a series of circumferential ridges and grooves 150, which carry the abrasive slurry towards the wafer 125 and carry away oxide removed from the wafer 125. A conditioning head 140 is provided that typically comprises an abrasive-encrusted (e.g. diamond, or silicon oxide) pad, which acts to roughen the surface of the polishing pad 110. The slurry, generally comprised of Silicon Oxide particles, is introduced to polishing pad 110 through a series of nozzles 135 located on a slurry deposition head 130. The wafer 125 is orientated face down and is secured to a wafer head 120, which moves vertically to bring the wafer 125 in contact with the polishing pad 110.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

Figure 1A:
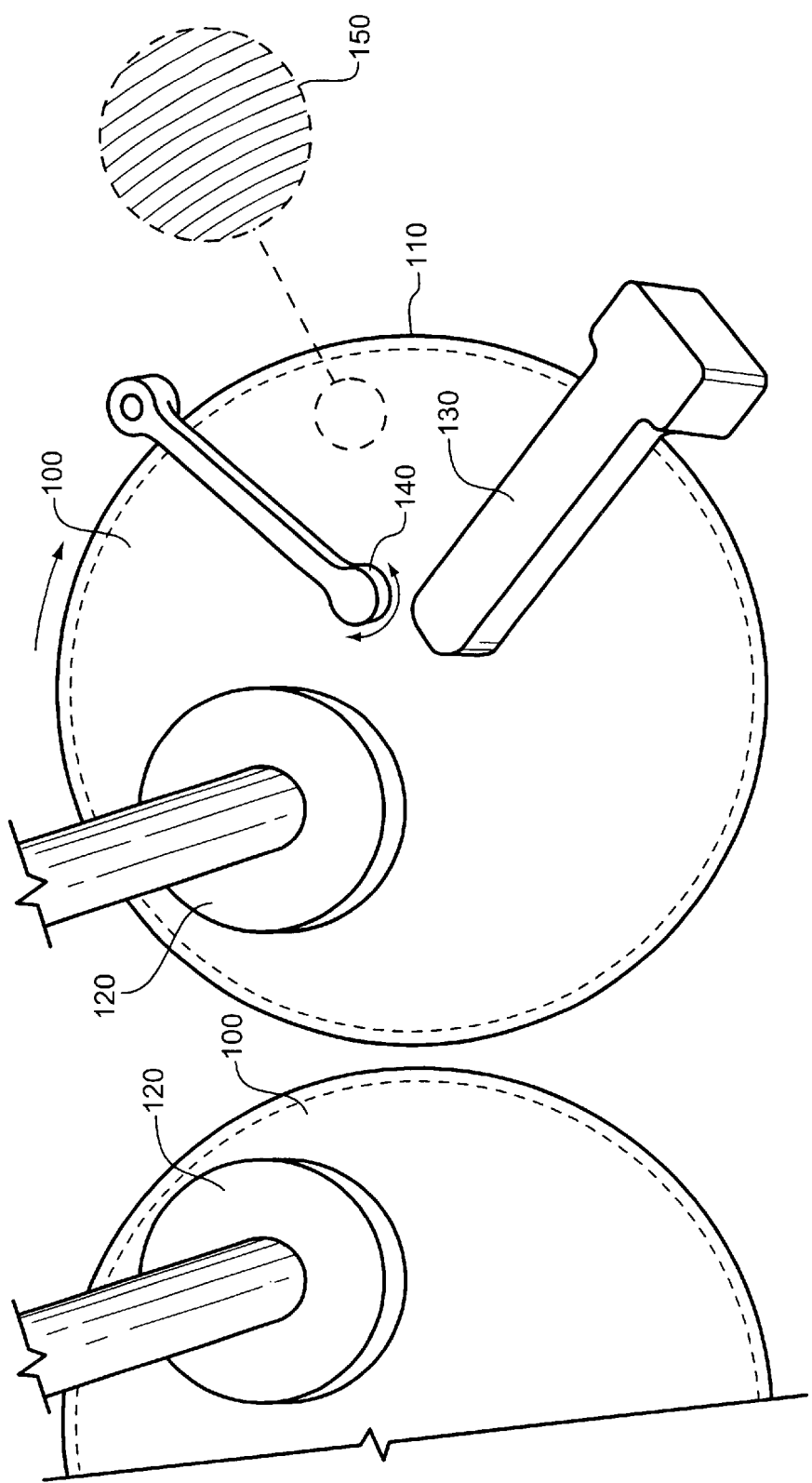
FIGS. 1a and 1b are prior art illustrations of a portion of a typical wafer polishing machine.
Figure 1B:
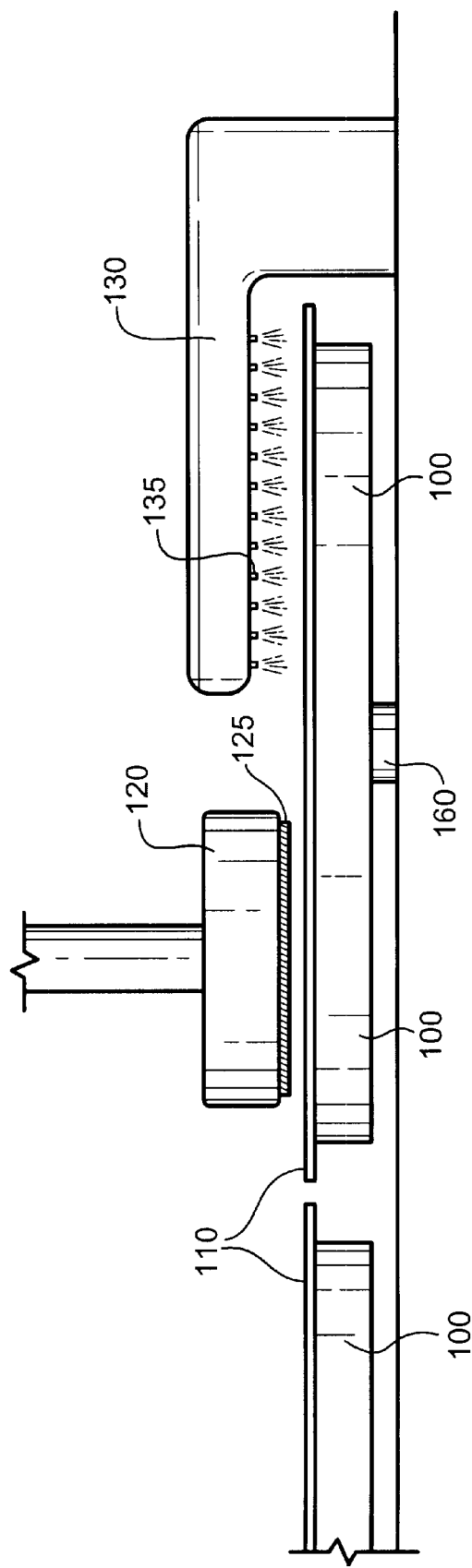

An apparatus for centering a wafer polishing pad on a polishing machine platen is described, as well as a method for using the apparatus.

Wafer polishing pads must be replaced periodically when they wear out. It is important that the replacement polishing pads 110 be properly centered on the platens 100. The pads 110 of adjacent platens 100 are separated by only a small distance. Improperly centered pads 110 might impact an adjacent pad 110, potentially introducing particles into the clean room environment due to abrasion between the pads 110. Furthermore, if the pad is not centered, the circular grooves and ridges 150, which circumscribe the center of the polishing pad 110, will travel in an elliptical orbit around the center of the platen 100, potentially impacting the uniformity of the wafer polishing operation.

Because the polishing pads 110 typically have a larger diameter than the platens 100 to which they are attached, it is often difficult to precisely center the pads 110. Technicians, using prior art methods, rely on sight and rough finger measurements to determine whether a pad 110 is close to being centered over the platen 100 prior to lowering the back side of the pad 110 onto the surface of the platen 100. Once lowered onto the platen 100, a pressure-sensitive adhesive film covering at least a portion of the pad 110 secures the pad 110 to the platen 100 and further centering adjustments are not possible without completely removing the pad 110. Repeated removal and reinstallation of the polishing pad 110 can cause the adhesive film to become compromised.

The pad centering apparatus described herein permits a polishing pad 110 to be centered on a platen 100 during the first installation. Illustrations of two preferred embodiments of the polishing pad centering clips 200, 250 are provided in FIGS. 2a and 2b. The polishing pad centering clips 200, 250 comprise a base section 210, 260, an upper section 220, 270, and a threaded fastener 230, 280, to operatively connect the base and upper sections.

The base section 210, 260 is typically fabricated from a clean room approved plastic that is resistant to shedding of particles when impacting other materials, although base section 210, 260 can be fabricated from any number of other suitable materials in alternative embodiments. The base section 210, 260 has a generally horizontal surface 216, 266 on which the bottom of an outside portion of a polishing pad 110 can rest. Extending upward and orthogonally from the horizontal surface 216, 266 is a vertical surface 214, 264. The vertical surface 214, 264 acts as a stop which butts directly to the edge of polishing pad 110. Typically, the height of the vertical surface 214, 264 will be less than the thickness of the polishing pad 110. Spaced a predetermined distance from the vertical surface 214, 264 is a second vertical surface 212, 262 that extends downward and orthogonally from the horizontal surface 216, 266. The second vertical surface 212, 262 is configured to butt against the edge or side surface of a platen 100. The predetermined distance is equal to the radial length a properly-centered polishing pad 110 overhangs an associated polishing machine platen 100. In other words, the predetermined distance is equal to the difference between the radii of the polishing pad 110 and its associated platen 100. Vertical surface 214, 264 forms one side of a ridge 219, 269 that extends across the base section 210, 260. The ridge 219, 269 acts to provide support for the upper section 220, 270. A threaded receptacle 236, 286 extends through the base section 210, 260 at the ridge 219, 269 to receive the threaded fastener 230, 280. A finger hold portion 218, 268 extends behind ridge 219, 269 to provide a place for a technician to hold the clip 200, 250.

The upper section 220, 270 is typically fabricated from the same material as the base 210, 260. The base has a generally horizontal bottom surface 222, 272 of which a portion rests on the ridge 219, 269 of base section 210, 260. When properly attached to a polishing pad 110, the bottom surface 222, 272 is incident to the top surface of the polishing pad 110. A downwardly extending ridge 226, 276 protrudes from the upper section 220, 270 behind the portion of the bottom surface 222, 272 resting on base section ridge 219, 269. The height of ridge 226, 276 is typically the same as or slightly greater than the height of ridge 219, 269. A hole 234, 284 extends through the upper section 220, 270 to receive the threaded fastener 230, 280. Additionally, an upper finger hold portion 224, 274 extends behind ridge 226, 276 to provide a place for a technician to hold the clip 200, 250.

The threaded fastener 230, 280 is provided to both connect the base and upper sections, as well as provide a biasing force when tightened to help hold the pad edge securely against vertical surface 214, 264 during polishing pad 110 installation. In the preferred embodiment, a rubber washer 232, 282 is specified between the top of the upper section 220, 270 and the head of the threaded fastener 230, 280. The rubber washer 232, 282 adds a measure of resilience between the base 210, 260 and upper section 220, 270. Operationally, the rubber washer 232, 282 permits the technician to tighten the fastener 230, 280 prior to placing the clip 200, 250 on a polishing pad, whereby the gap between the horizontal surface 216, 266 and the bottom surface 222, 272 is less than the thickness of the polishing pad 110. The technician then slides the pad into the clip's opening. Bevels 228, 278 at the opening guide the pad 110 into the gap. By pushing in the pad 110 into the opening, the gap will expand as the rubber washer 232, 282 compresses and the upper section 220, 270 pivots at the intersection of ridge 226, 276 and the adjacent surface on the base section 210, 260. The rubber washer 232, 282 applies a biasing force to hold the pad 110 in place. To remove the clip 200, 250, the technician presses the base and upper finger holds portions 218, 268 and 224, 274 towards each other to compress the rubber washer 232, 282, the clip 200, 250 to be slid off of the pad 110.

Figure 2A:
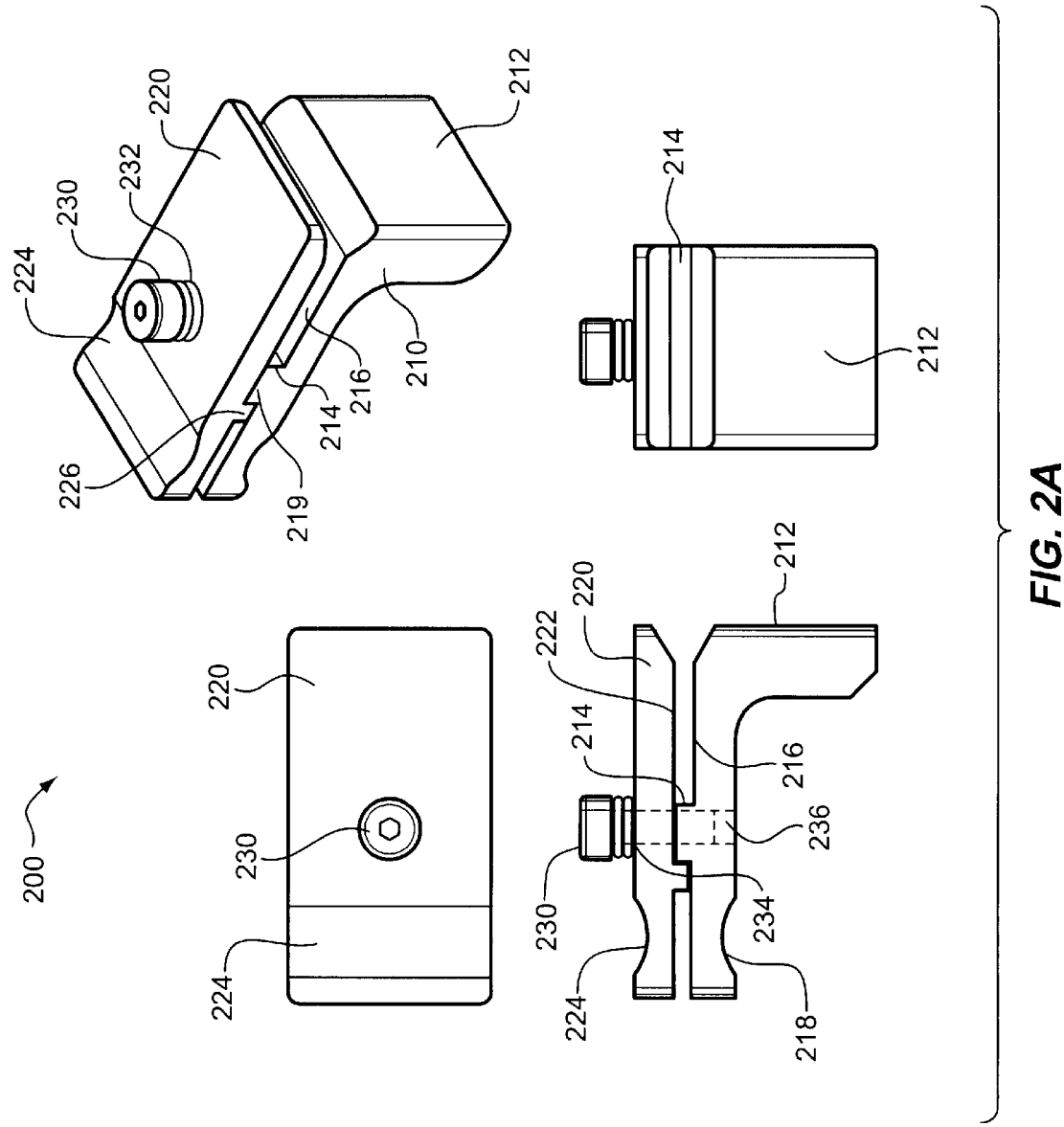
FIGS. 2a and 2b are illustrations of polishing pad centering clips according to two embodiments of the invention.
Figure 2B:
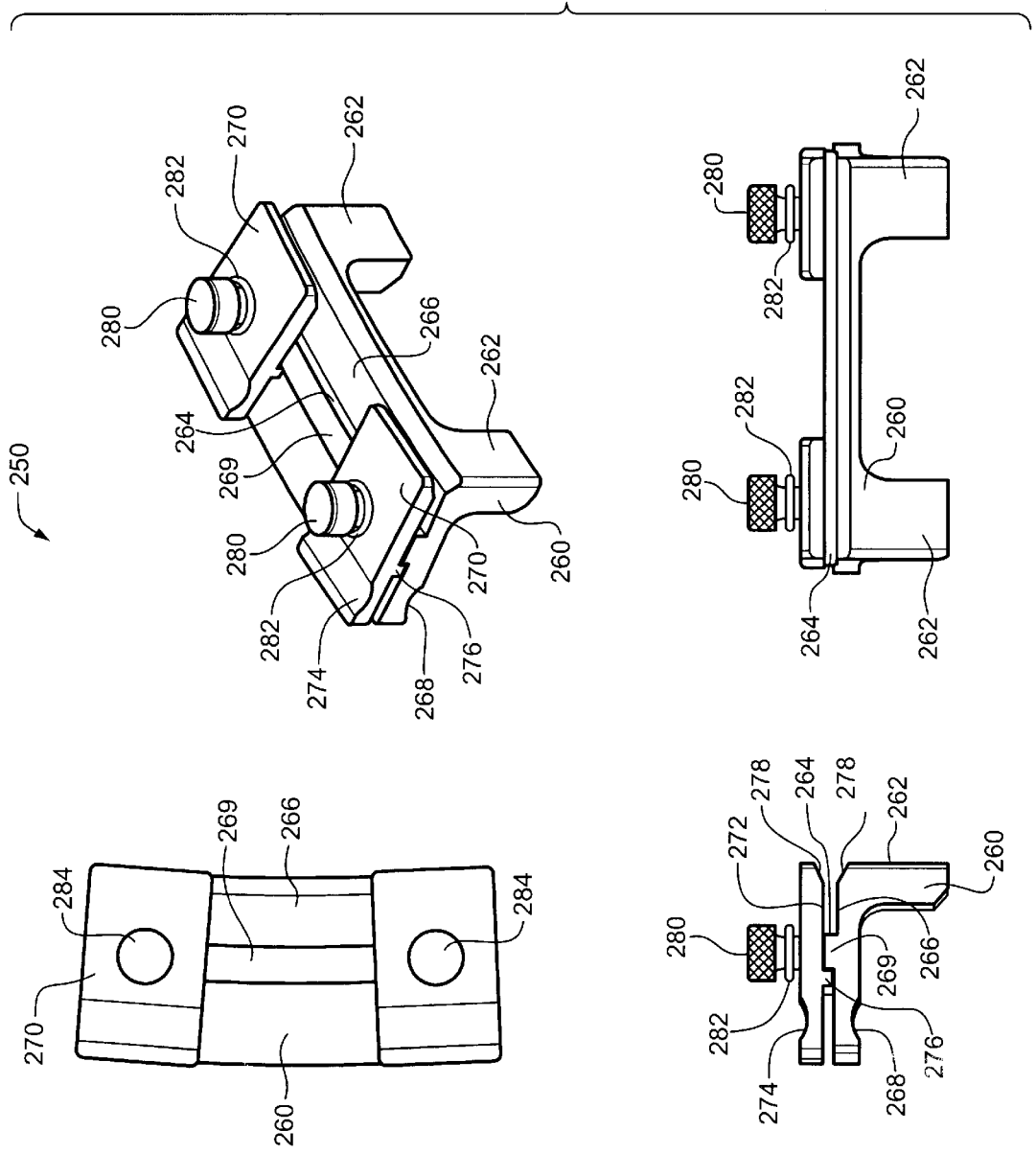

The pad centering apparatus illustrated in FIGS. 2a and 2b are merely exemplary. FIG. 2a illustrates a single clamp design optimized for use on 21.50" polishing pads 110 and associated platens 100 wherein the pad 110 overhangs the platen by 0.75" when properly centered. FIG. 2b illustrates a two-clamp design for use on 31" pads 110 and associated platens 100 wherein the pad 110 overhangs the platen by 0.50". Alternative polishing pad centering apparatus designs are contemplated. For instance, a centering clip could be fabricated as a unitary piece, wherein the resilience of the upper section could provide the biasing force to hold the pad 110 in place when the gap between the bottom surface and the horizontal surface is forced open to receive the pad 110. Other types of spring mechanisms to supply the biasing force could be utilized such as coil and leaf springs as would be evident to one with skill in the art. In other designs, no spring element may be specified relying only on mechanical clamping force such as that supplied by a tightened fastener. Additionally, the upper section of the center apparatus may be eliminated completely, wherein the adhesive film on the bottom of the pad 110 acts to secure the horizontal surface of the base section to the pad 110 during the pad installation process.

Figure 3:
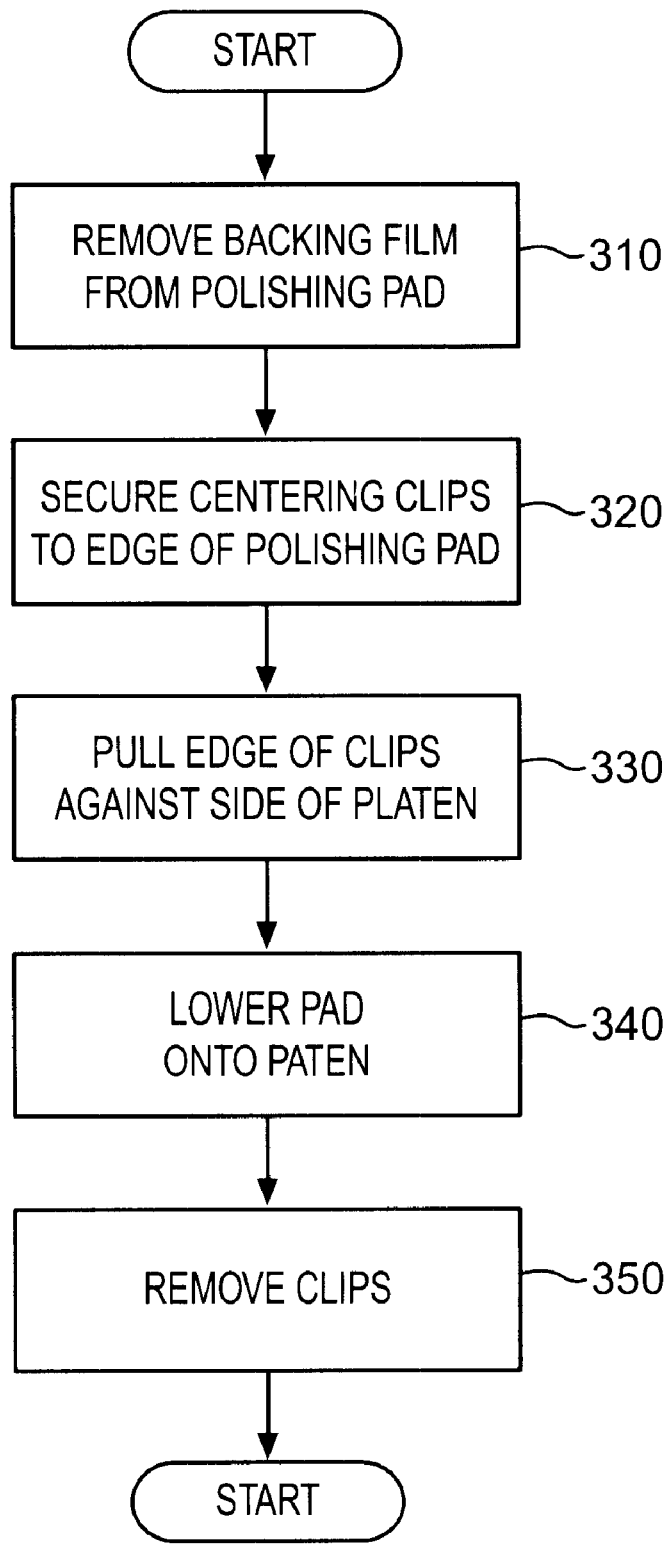
FIG. 3 is a flow chart describing the use of a polishing pad centering apparatus according to one embodiment of the invention.
Figure 4:
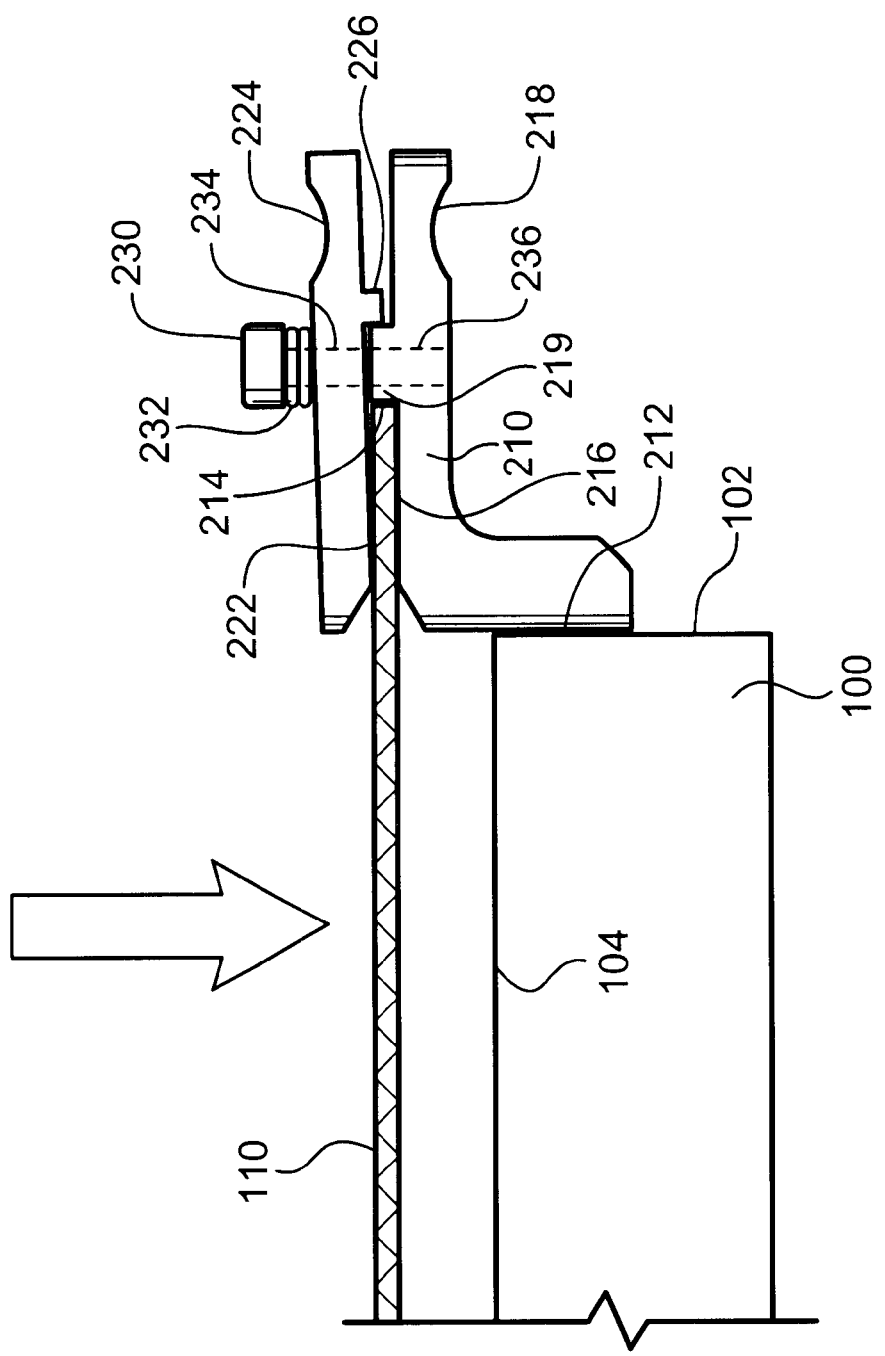
FIG. 4 illustrates a polishing pad centering clip as it is intended to be used to center a polishing pad on the polishing machine's platen according to one embodiment of the invention.

FIG. 3 is a flow chart describing the use of pad center apparatus to install a pad 110 on an associated platen 100. As way of example, FIG. 4 is an accompanying illustration of a single clamp pad centering clip 200 of the preferred design installed on a polishing pad 110 during installation of the polishing pad 110. In step 310, release backing is removed from the bottom of the pad 110 to expose an adhesive film deposited thereon. Next, as shown in block 320, a pad centering clip 200 is installed on the pad 110 such that the edge of the pad 110 contacts the vertical surface 214 of the clip 200 as shown in FIG. 4. If necessary, the fastener 230 may be tightened. Generally, a second pad centering clip 200 will also be attached to the pad 110 at a position spaced 35–135 degrees apart from the first clip 200. In block 330, the pad 110 is positioned over the platen 100 and the vertical surfaces 212 of both pad centering clips 200 are simultaneously butted up against the side 102 of the platen 100 as shown in FIG. 4. In block 340, the pad 110 is lowered onto the top surface 104 of platen 100 while maintaining contact between surfaces 212 and the platen side 102. Any air bubbles are smoothed out of the interface between the platen top 104 and the bottom surface of the pad 110 to fully secure the pad 110 to the platen 100. Finally, in block 350, the pad centering clips 200 are removed from the pad 110.

In alternative embodiments of the process described in FIG. 3, a single pad centering apparatus may be utilized provided the distance between edges of the centering apparatus along the circumference of the pad 110 is sufficient to ensure that the pad 110 is centered when both edges of the centering apparatus are in contact with the platen's side surface 102. Additionally, alternative pad centering apparatus may be utilized in place of the preferred embodiment pad centering clips 200, 250 described supra.

In the foregoing description, for the purposes of explanation, numerous specific details were set forth in order to provide a thorough understanding of the present invention. The invention is, however, not limited to the described embodiments alone. In this vein, the detailed description provided herein is not intended to limit the scope of the invention as clamied. To the contrary, embodiments of the claims have been contemplated that encompass the full breadth of the claim language. Accordingly, the present invention may be practiced without some of the specific detail provided supra.

What is claimed is:

1. A wafer polishing pad centering apparatus comprising:

a platen-butting surface; and a pad edge-butting surface generally parallel to and coupled with the platen-butting surface, the pad edge-butting surface spaced from the platen-butting surface a predetermined distance;

a clamping means for securing the wafer polishing pad centering apparatus to a wafer polishing pad.

2. The wafer polishing pad centering apparatus of claim 1, further comprising:

a pad support surface generally orthogonal to and coupled between the platen-butting surface and the pad edge-butting surface, the platen-butting surface extending downward relative to the pad support surface and the pad edge-butting surface extending upward relative to the pad support surface.

3. The wafer polishing pad centering apparatus of claim 2, further comprising:

a clip element operatively coupled with the wafer polishing pad centering apparatus, the clip element having an inside surface, the inside surface facing the pad support surface.

4. The wafer polishing pad centering apparatus of claim 3, wherein the inside surface is biased against a top surface of a wafer polishing pad when at least a portion of a wafer polishing pad is placed between the pad support surface and the inside surface.

5. The wafer polishing pad centering apparatus of claim 4, wherein a static spacing between the inside surface and the pad support surface is less than a thickness of the wafer polishing pad, and the clip element is comprised of a resilient material.

6. The wafer polishing pad centering apparatus of claim 1, wherein the pad edge-butting surface has a height, the height being equal to or less than a thickness of a polishing pad.

7. The wafer polishing pad centering apparatus of claim 1, wherein the wafer polishing pad centering apparatus is comprised of a plastic material.

8. A wafer polishing pad centering clip comprising:

a base element comprising, a pad support surface, a platen-butting surface coupled with the pad support surface, the platen-butting surface being generally orthogonal to and extending downward relative to the pad support surface; and a pad edge-butting surface coupled with the pad support surface, the pad edge-butting surface being generally orthogonal to and extending upward relative to the pad support surface, the pad edge-butting surface spaced from the platen-butting surface a predetermined distance; and a top element operatively connected with the base element, the top element comprising, a bottom surface, the bottom surface facing the pad support surface, and spaced from the pad support surface;

means for securing the pad edge-butting surface of the wafer polishing pad centering clip against an edge of a wafer polishing pad by clamping the wafer polishing pad centering clip to the wafer polishing pad.

9. The wafer polishing pad centering clip of claim 8, wherein the distance between the bottom surface and the pad support surface is generally equal to or less than the thickness of a wafer polishing pad.

10. The wafer polishing pad centering clip of claim 8, wherein the base and top elements are comprised of a plastic material.

11. A polishing pad centering clip of claim 8, further comprising:

a threaded fastener to operatively connect the top and base elements;

wherein both the base element and the top element further comprise either a threaded cavity or a receptacle to receive the threaded fastener.

12. The polishing pad centering clip of claim 11, wherein the threaded fastener when tightened applies a biasing force against a portion of the wafer polishing pad when a portion of the wafer polishing pad is placed between the pad support surface and the bottom surface.

13. The polishing pad centering clip of claim 8, wherein the top and base elements further comprise finger holds.

14. A method of centering a wafer polishing pad on a platen, the method comprising:

securing a first pad edge-butting surface of a first polishing pad centering apparatus against an edge of a wafer polishing pad, the first polishing pad centering apparatus comprising, a first platen-butting surface, and the first pad edge-butting surface generally parallel to and coupled with the first platen-butting surface, the first pad edge-butting surface spaced from the first platen-butting surface a predetermined distance;

butting the first platen-butting surfaces against a side edge of a platen; and lowering the bottom surface of the wafer polishing pad into contact with a top surface of the platen.

15. The method of claim 14, further comprising:

securing a second pad edge-butting surface of a second polishing pad centering apparatus against the edge of the wafer polishing pad, the second polishing pad centering apparatus comprising, a second platen-butting surface, and the second pad edge-butting surface generally parallel to and coupled with the second platen-butting surface, the second pad edge-butting surface spaced from the second platen-butting surface the predetermined distance; and butting the second platen-butting surface against the side edge of the platen.

16. The method of claim 14, further comprising removing a release film from the bottom surface.

17. The method of claim 16, wherein the bottom surface has deposed at least partially thereon an adhesive.

18. The method of claim 16 wherein said securing a first edge-butting surface of a first polishing pad centering apparatus against an edge of a wafer polishing pad further comprises:

clamping the first pad centering apparatus to the wafer polishing pad.

19. The method of claim 16, further comprising removing the first and second pad centering apparatus from the wafer polishing pad after said lowering the bottom surface of the wafer polishing pad into contact with a top surface of the platen.

20. A method of centering a wafer polishing pad on a platen comprising:

exposing an adhesive layer applied to at least a portion of a back surface of the wafer polishing pad by removing a release film from the back surface pad;

securing a first pad edge-butting surface of a first wafer polishing pad centering clip against an edge of the wafer polishing pad by clamping the first wafer polishing pad centering clip to the wafer polishing pad, the first polishing pad centering clip comprising, a first platen-butting surface, and the first pad edge-butting surface generally parallel to and coupled with the first platen-butting surface, the first pad edge-butting surface spaced from the first platen-butting surface a predetermined distance;

securing a second pad edge-butting surface of a second wafer polishing pad centering clip against the edge of the wafer polishing pad, the second polishing pad centering clip comprising,
a second platen-butting surface, and
the second pad edge-butting surface generally parallel to and coupled with the second platen-butting surface, the second pad edge-butting surface spaced from the second platen-butting surface the predetermined distance;

simultaneously butting the first and second platen-butting surfaces against a side surface of a platen while suspending the bottom surface of the wafer polishing pad above a top surface of the platen;

securing the wafer polishing pad to the top surface by lowering the bottom surface on to the top surface while maintaining contact between the first and second platen-butting surfaces with the side surface of the platen.

21. The method of claim 20, wherein the first wafer polishing pad centering clip further comprises a clamp arm configured to apply a clamping force to a top surface of the polishing pad when the pad edge-butting surface is secured to the edge of the polishing pad.

22. The method of claim 20, further comprising removing the first and second polishing pad centering clips.

23. The method of claim 20, wherein the first and second polishing pad centering apparatus are placed apart from each other along a circumference of the polishing pad approximately 35 to 145 degrees.

24. A method of centering a wafer polishing pad on a platen, the method comprising the steps of:
a step for securing a first a pad edge-butting surface of a first polishing pad centering apparatus against an edge of a wafer polishing pad, the first polishing pad centering apparatus comprising,
a first platen-butting surface, and
the first pad edge-butting surface generally parallel to and coupled with the first platen-butting surface, the first pad edge-butting surface spaced from the first platen-butting surface a predetermined distance;
a step for butting the first platen-butting surfaces against a side edge of a platen; and
a step for lowering the bottom surface of the wafer polishing pad into contact with a top surface of the platen.

25. The method of claim 24, further comprising the steps of:
a step for securing a second pad edge-butting surface of a second polishing pad centering apparatus against the edge of the wafer polishing pad, the second polishing pad centering apparatus comprising,
a second platen-butting surface, and
the second pad edge-butting surface generally parallel to and coupled with the second platen-butting surface, the second pad edge-butting surface spaced from the second platen-butting surface the predetermined distance; and
a step for butting the second platen-butting surface against the side edge of the platen.

26. The method of claim 24, further comprising a step for removing a release film from the bottom surface.

27. The method of claim 26, wherein the bottom surface has deposed at least partially thereon an adhesive.

28. The method of claim 24 wherein the step for securing a first edge-butting surface of a first polishing pad centering apparatus against an edge of a wafer polishing pad further comprises a step for clamping the first pad centering apparatus to the wafer polishing pad.

29. The method of claim 24, further comprising a step for removing the first and second pad centering apparatus from the wafer polishing pad after said lowering the bottom surface of the wafer polishing pad into contact with a top surface of the platen.

30. A method of centering a wafer polishing pad on a platen comprising the steps of:
a step for exposing an adhesive layer applied to at least a portion of a back surface of the wafer polishing pad by removing a release film from the back surface pad;
a step for securing a first pad edge-butting surface of a first wafer polishing pad centering clip against an edge of the wafer polishing pad by clamping the first wafer polishing pad centering clip to the wafer polishing pad, the first polishing pad centering clip comprising,
a first platen-butting surface, and
the first pad edge-butting surface generally parallel to and coupled with the first platen-butting surface, the first pad edge-butting surface spaced from the first platen-butting surface a predetermined distance,
a step for securing a second pad edge-butting surface of a second wafer polishing pad centering clip against the edge of the wafer polishing pad, the second polishing pad centering clip comprising,
a second platen-butting surface, and
the second pad edge-butting surface generally parallel to and coupled with the second platen-butting surface, the second pad edge-butting surface spaced from the second platen-butting surface the predetermined distance;
a step for simultaneously butting the first and second platen-butting surfaces against a side surface of a platen while suspending the bottom surface of the wafer polishing pad above a top surface of the platen;
a step for securing the wafer polishing pad to the top surface by lowering the bottom surface on to the top surface while maintaining contact between the first and second platen-butting surfaces with the side surface of the platen.

31. The method of claim 30, wherein the first wafer polishing pad centering clip further comprises a clamp arm configured to apply a clamping force to a top surface of the polishing pad when the pad edge-butting surface is secured to the edge of the polishing pad.

32. The method of claim 30, further comprising a step for removing the first and second polishing pad centering clips.

33. The method of claim 30, wherein the first and second polishing pad centering apparatus are placed apart from each other along a circumference of the polishing pad approximately 35 to 145 degrees.

* * * * *